US009864113B2

(12) United States Patent
Liu et al.

(10) Patent No.: US 9,864,113 B2
(45) Date of Patent: Jan. 9, 2018

(54) METHOD FOR MANUFACTURING HOLOGRAPHIC BLAZED GRATING

(71) Applicant: Soochow University, Jiangsu (CN)

(72) Inventors: Quan Liu, Jiangsu (CN); Jianhong Wu, Jiangsu (CN); Minghui Chen, Jiangsu (CN)

(73) Assignee: Soochow University, Jiangsu (CN)

( * ) Notice: Subject to any disclaimer, the term of this patent is extended or adjusted under 35 U.S.C. 154(b) by 75 days.

(21) Appl. No.: 14/352,766

(22) PCT Filed: Oct. 15, 2012

(86) PCT No.: PCT/CN2012/082942
§ 371 (c)(1),
(2) Date: Aug. 14, 2014

(87) PCT Pub. No.: WO2013/056637
PCT Pub. Date: Apr. 25, 2013

(65) Prior Publication Data
US 2014/0353141 A1    Dec. 4, 2014

(30) Foreign Application Priority Data

Oct. 19, 2011 (CN) .......................... 2011 1 0318454

(51) Int. Cl.
*C23C 14/35* (2006.01)
*G02B 5/18* (2006.01)
(Continued)

(52) U.S. Cl.
CPC ............ *G02B 5/1857* (2013.01); *C23C 14/00* (2013.01); *C23C 14/022* (2013.01);
(Continued)

(58) Field of Classification Search
CPC ..... C23C 14/022; C23C 14/027; C23C 14/00; C23F 4/00
See application file for complete search history.

(56) References Cited

U.S. PATENT DOCUMENTS 5,417,799 A * 5/1995 Daley ................. C04B 41/5346
216/24
7,175,773 B1   2/2007 Heidemann
(Continued)

FOREIGN PATENT DOCUMENTS

CN           1036868 C      12/1997
CN        101320207 A       12/2008
(Continued)

OTHER PUBLICATIONS

A Dictionary of Solid State Physics (1995) Dry Etching, pp. 365 (with English translation).
(Continued)

*Primary Examiner* — Jason Berman
(74) *Attorney, Agent, or Firm* — Swanson & Bratschun, L.L.C.

(57) ABSTRACT

A method for fabricating a holographic blazed grating is provided. The method includes: coating a photoresist layer on a substrate; performing lithography on the photoresist layer to form a photoresist grating; performing vertical ion beam etching on the substrate by using the photoresist grating as a mask, to form a homogeneous grating by transferring a pattern of the photoresist grating onto the substrate; cleaning the substrate to remove remaining photoresist; performing tilted Ar ion beam scanning etching on the substrate by using the homogeneous grating as a mask, and etching different portions of the substrate by utilizing a obscuring effect of the homogeneous grating mask on the ion beam, to form a triangular groove shape of the blazed (Continued)

grating; and cleaning the substrate to obtain the holographic blazed grating.

7 Claims, 7 Drawing Sheets

(51) Int. Cl.
| | |
|---|---|
| *C23C 14/00* | (2006.01) |
| *C23C 14/02* | (2006.01) |
| *C23F 4/00* | (2006.01) |
| *G03F 7/00* | (2006.01) |
| *G03H 1/02* | (2006.01) |
| *G03H 1/18* | (2006.01) |

(52) U.S. Cl.
CPC .............. *C23C 14/027* (2013.01); *C23F 4/00* (2013.01); *G02B 5/1861* (2013.01); *G03F 7/0005* (2013.01); *G03H 1/0244* (2013.01); *G03H 1/182* (2013.01); *G03H 2224/04* (2013.01); *G03H 2260/14* (2013.01)

(56) References Cited

U.S. PATENT DOCUMENTS

| | | | |
|---|---|---|---|
| 7,455,957 B2 * | 11/2008 | Koeda ................ | G02B 5/1857 216/24 |
| 2002/0008912 A1 | 1/2002 | Kleemann | |
| 2002/0122255 A1 | 9/2002 | Ogusu et al. | |
| 2003/0124313 A1 | 7/2003 | Nagano | |
| 2005/0130072 A1 | 6/2005 | Koeda | |
| 2006/0216478 A1 | 9/2006 | Nagano | |
| 2013/0105438 A1 | 5/2013 | Zhu | |
| 2014/0353141 A1 | 12/2014 | Liu | |

FOREIGN PATENT DOCUMENTS

| | | |
|---|---|---|
| CN | 101726779 | 6/2010 |
| CN | 101799569 | 8/2010 |
| CN | 102323634 | 1/2012 |
| CN | 102360093 | 2/2012 |
| CN | 102540302 | 7/2012 |
| CN | 102565905 | 7/2012 |
| JP | 56-043620 | 4/1981 |
| JP | 60-033501 | 2/1985 |
| JP | 60-033504 | 2/1985 |
| JP | 60-083902 | 5/1985 |
| JP | 06338443 A1 * | 12/1994 |
| JP | 08082551 A1 * | 3/1996 |
| JP | 2002-189112 | 7/2002 |
| WO | WO 2008/081555 | 7/2008 |

OTHER PUBLICATIONS

Hong, et al. (2008) Vacuum 45(3):25-27 "Development of plasma photoresist descum system for large-aperture diffraction gratings" (with English abstract).
International Search Report dated Jan. 24, 2013, from PCT/CN2012/082942.
Wang, et al. (2011) ACTA Optica Sinica 31(4):0405002-1-0405002-4, Apr. 2011, pages, ISSN 0253-2239 "Fabrication of Convex Blazed Grating By Ar+ Ion-Beam Etching, 1-8", (with English abstract).
Xu, et al. (2003) Vacuum Science and Technology, 23(5):362-364, 372, Oct. 2003 ISSN 1672-7126 "Application of Photoresist-Ashing to Diffraction Grating Fabrication 3 by Holographic Ion Beam Etching" (with English abstract).
Yang, (2008) China Master's Theses Full Text Database, "Study on Characteristics of the Reaction Ion Beam Etching of Holographic 4, 8 Grating" (with English abstract).
International Search Report dated Jan. 17, 2013, from PCT/CN2012/082674.

* cited by examiner

METHOD FOR MANUFACTURING HOLOGRAPHIC BLAZED GRATING

RELATED APPLICATIONS

This application is a 35 U.S.C. §371 national phase application of PCT/CN2012/082942 (WO 2013/056637), filed on Oct. 15, 2012, entitled "Method for Manufacturing Holographic Blazed Grating", which application claims priority to Chinese Application No. 201110318454.X, filed Oct. 19, 2011, each of which is incorporated herein by reference in its entirety.

CROSS REFERENCE TO RELATED APPLICATION

This application claims priority to Chinese patent application No. 201110318454.X titled "METHOD FOR FABRICATING HOLOGRAPHIC BLAZED GRATING" and filed with the State Intellectual Property Office on Oct. 19, 2011, which is incorporated herein by reference in its entirety.

FIELD

The present disclosure relates to a method for fabricating a diffraction optical element, and in particular to a method for fabricating a holographic blazed grating.

BACKGROUND

The grating is a key element widely used as a high efficient dispersive optical element, and it plays an important role in the modern optical instrumentation.

As well known, the direction of the main diffraction peak for a single slit is both the geometric optical propagation direction of light and the direction of the zero order for the multi-slit grating. It is in the direction of the main diffraction peak for the single slit, where the light with various wavelengths concentrate. In practical application, it is tended that the light energy is concentrated on a specific order as far as possible. Therefore, it is necessary to fabricate a groove determined by a calculation, such that the direction of the main diffraction peak for a single slit (or the geometric optical propagation direction of light) is consistent with the direction of the predetermined diffraction order for the grating. In this case, most of the light energy may be concentrated on the predetermined diffraction order. The phenomenon is referred to as blaze, and the grating is referred to as a blazed grating. The diffraction efficiency of the grating is greatly improved due to the blaze.

It is common to fabricate the blaze grating with the holographic ion beam etching, by which the purpose of removing material and molding is achieved by spluttering of an ion beam on the material, and the advantages, such as high resolution, and good directionality are generated.

Figure 1:
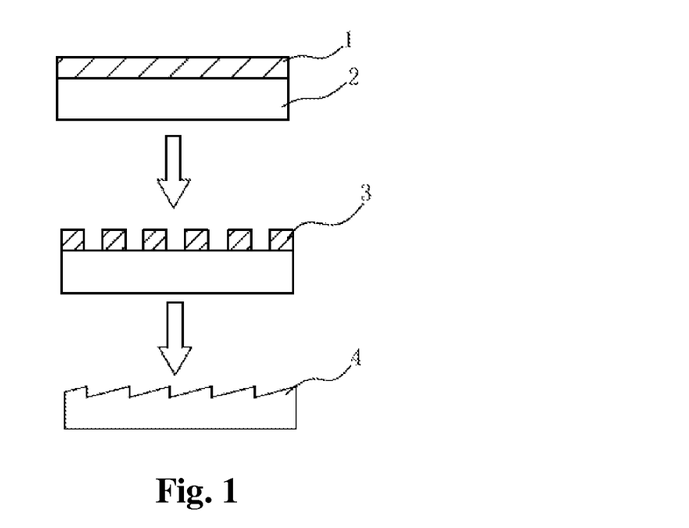
FIG. 1 is a general fabricating process diagram of the existing holographic ion beam etching blazed grating.

The general process for fabricating a blazed grating with the holographic ion beam etching is shown as FIG. 1. Firstly a layer of photoresist 2 is coated on a quartz glass substrate 1, and a grating mask 3 whose surface relief photoresist is formed on the substrate after the processes of holographic lithography. Tilted Ar ion beam etching is performed by using the grating mask 3. The different portions of the substrate are etched by utilizing the obscuring effect of the mask on the ion beam. A triangular groove shape 4 is obtained on the substrate after the photoresist is etched. The blazed grating fabricating with the ion beam etching has advantages of a good groove shape, a precise control of a blaze angle, a low roughness and so on, which is widely used in engineering.

However, since the blaze angle of the grating fabricated with the holographic ion beam etching mainly depends on three factors of a duty cycle, a groove depth and a groove shape of the photoresist mask. At present, it is not yet addressed that the control of the duty cycle, the groove depth and the groove shape during the process of interference exposure for the photoresist. Therefore, it is difficult to achieve the control of the blaze angle.

Thus, it is necessary to seek for a new method for fabricating a holographic blazed grating to address the above-mentioned issue.

SUMMARY

In view of the above, the object of the disclosure is to provide a method for fabricating a holographic blazed grating capable of precisely controlling a blaze angle of the holographic blazed grating.

The method for fabricating the holographic blazed grating provided according to the object of the disclosure includes:

1) coating a photoresist layer on a substrate;
2) performing lithography on the photoresist layer to form a photoresist grating;
3) performing vertical ion beam etching on the substrate by using the photoresist grating as a mask, to form a homogeneous grating by transferring a pattern of the photoresist grating onto the substrate;
4) cleaning the substrate to remove remaining photoresist;
5) performing titled Ar ion beam scanning etching on the substrate by using the homogeneous grating as a mask, and etching different portions of the substrate by utilizing the obscuring effect of the homogeneous grating mask on ion beam, to form a triangular blazed grating groove shape; and
6) cleaning the substrate to obtain the holographic blazed grating.

Optionally, the coated photoresist in the Step 1) has a thickness of 200 nm to 500 nm.

Optionally, after the Step 2), the method further includes performing an ashing process on the photoresist grating to regulate a duty cycle of the photoresist grating.

Optionally, in the Step 3) an Ar ion beam etching method or a $CHF_3$ reaction ion beam etching method is adopted as the vertical ion beam etching; where in the case that the Ar ion beam etching method is adopted, specific technological parameters are ion energy of 380 eV to 520 eV, an ion beam current of 70 mA to 140 mA, an acceleration voltage of 240 V to 300 V and a working pressure of $2.0 \times 10^{-2}$ Pa; and in the case that the $CHF_3$ reaction ion beam etching method is adopted, the specific technological parameters are ion energy of 300 eV to 470 eV, an ion beam current of 70 mA to 140 mA, an acceleration voltage of 200 V to 300 V and a working pressure of $1.4 \times 10^{-2}$ Pa.

Optionally, a duty cycle of the homogeneous grating ranges from 0.25 to 0.6, and a period of the grating ranges from 300 nm to 3000 nm.

Optionally, the homogeneous grating is a rectangle grating or a trapezoid grating.

Optionally, the etching angle for the tilted Ar ion beam is equal to the angle required for the tilted Ar ion beam slanting from a vertex angle of the homogeneous grating to a base angle opposite to the vertex angle, due to the groove depth of the homogeneous grating.

Optionally, in the Step 4) technological parameters for the tilted Ar ion beam scanning etching are ion energy of 380 eV to 520 eV, an ion beam current of 70 mA to 140 mA, an acceleration voltage of 240 V to 300 V, a working pressure of $2.0 \times 10^{-2}$ Pa and the etching angle of the tilted Ar ion beam of 8 degrees to 40 degrees.

With the above-mentioned technical solution, the disclosure has the following advantages compared with the conventional technology.

1. According to the disclosure, it is achieved that the groove shape of the homogeneous grating is precisely controlled by using an ashing technique and ion beam etching (in which the duty cycle f of the grating is controlled by using the ashing technique and the groove depth d is controlled by using ion beam etching).

2. According to the disclosure, it is achieved that the blaze angel is precisely controlled by etching the homogeneous grating mask with the tilted ion beam.

BRIEF DESCRIPTION OF THE DRAWINGS

In order to explain the technical solutions in embodiments of the present invention or the conventional technology more clearly, accompanying drawings of the embodiments or the conventional technology are briefly illustrated hereinafter. Apparently, the accompanying drawings described hereinafter are only a few of embodiments of the present invention, and those skilled in the art can further conceive other drawings according to the drawings without creative work.

DETAILED DESCRIPTION

In the existing method for fabricating a holographic blazed grating, a grating is fabricated on a photoresist layer, and the photoresist grating acts as a mask. There are the following issues in the above method. In the process of interference lithography, it is difficult to precisely control duty cycle, groove depth and groove shape of the photoresist grating due to the exposure technique and the developing technique. Therefore, it is difficult to precisely control the blaze angle.

However, according to the present disclosure, firstly a homogeneous grating is fabricated on a substrate, and using the homogeneous grating as a mask, a blazed grating is formed by performing tilted Ar ion beam scanning etching. Compared with the conventional technique, the groove depth and groove shape of the homogeneous grating according to the disclosure may be controlled by controlling vertical ion beam etching, and the duty cycle of the grating may be controlled by performing an ashing process on the photoresist grating. Therefore, in fabricating the blazed grating, a required blaze angle may be obtained by appropriately setting the above-mentioned several parameters, and thus precisely controlling the fabrication technique for the blazed grating.

Figure 2:
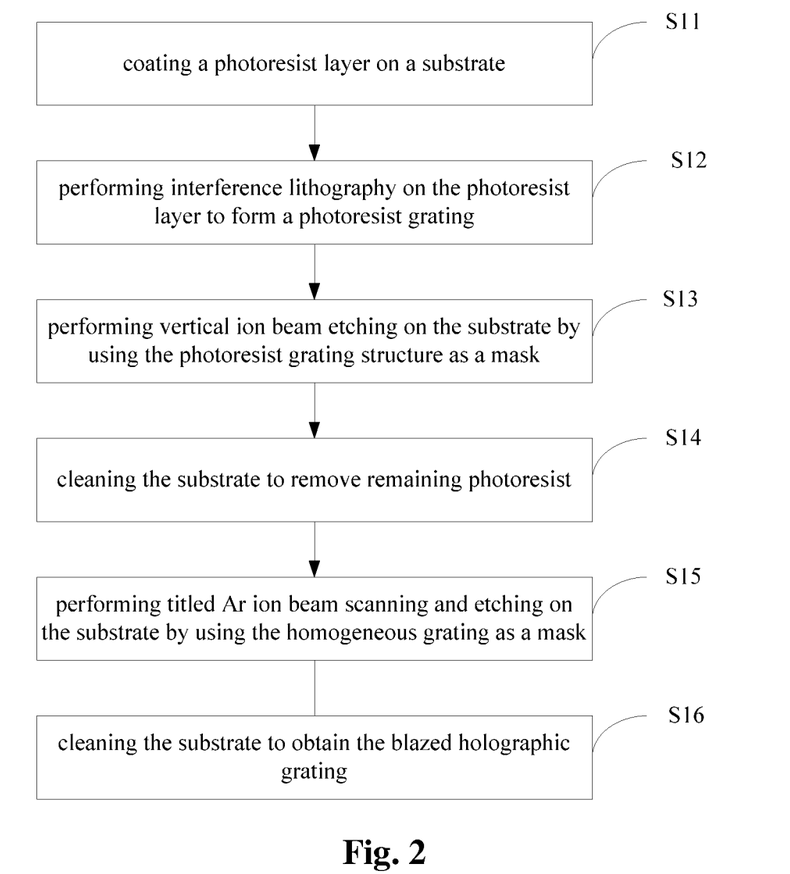
FIG. 2 is a flowchart of a method for fabricating a holographic blazed grating according to the disclosure.

Referring to FIG. 2, FIG. 2 is a flowchart of a method for fabricating a holographic blazed grating according to the disclosure. As shown in FIG. 2, the flowchart of the method for fabricating the holographic blazed grating according to the disclosure includes Step 11 to Step 16.

Step 11 may include coating a photoresist layer on a substrate. The technique for coating photoresist layer may be spin-coating, or may also be steamed-coating. The coated photoresist layer has a thickness of 200 nm to 500 nm. The photoresist layer may be a positive photoresist layer, or may also be a negative photoresist layer, which may be depended on the subsequent different processes. In this disclosure, it is illustrated by taking the positive photoresist layer as an example.

Step 12 may include performing interference lithography on the photoresist layer to form a photoresist grating. Laser interference lithography, or mask lithography may be adopted in the step of lithography. In the present disclosure, the laser interference lithography technology is adopted. Specifically, two or more beams of coherent light are formed after light emitted from a laser source is split into light paths, and the two or more beams of coherent light are converged on the surface of the photoresist layer by using a lens to form an interference pattern of light and dark regions. The property of the photoresist in the exposure region of the interference pattern changes. A surface relief grating structure is formed on the photoresist layer by developing.

Optionally, after the photoresist grating structure is formed, an ashing process is performed on the photoresist layer. The duration for the ashing process depends on the required duty cycle of the grating. In general, the duty cycle of the grating structure formed by performing lithography on the photoresist ranges from 0.5 to 0.6. It is difficult to regulate the duty cycle of the grating by using lithography technique. Thus, the duty cycle of the photoresist grating structure is regulated by introducing the ashing technique in the present disclosure. With the ashing technique, the duty cycle of the grating structure may be regulated effectively in a range from 0.25 to 0.6.

Step 13 may include performing vertical ion beam etching on the substrate by using the photoresist grating structure as a mask, to form a homogeneous grating by transferring the photoresist grating structure onto the substrate. An Ar ion beam etching method or a $CHF_3$ reaction ion beam etching method may be adopted in the vertical ion beam etching. The specific technological parameters are ion energy of 380 eV to 520 eV, an ion beam current of 70 mA to 140 mA, an acceleration voltage of 240 V to 300 V and a working pressure of $2.0 \times 10^{-2}$ Pa, in the case that the Ar ion beam etching is adopted; and the specific technological parameters are ion energy of 300 eV to 470 eV, an ion beam current of 70 mA to 140 mA, an acceleration voltage of 200 V to 300 V and a working pressure of $1.4 \times 10^{-2}$ Pa, in the case that the $CHF_3$ reaction ion beam etching method is adopted.

Step 14 may include cleaning the substrate to remove remaining photoresist. After the vertical ion beam etching is completed, there is remaining photoresist on the surface of the substrate. The remaining photoresist is removed by using the solution of sulfuric acid mixing with oxidizer, and the remaining photoresist is removed by full reaction to expose the homogeneous grating on the substrate.

Step 15 may include performing tilted Ar ion beam scanning etching on the substrate by using the homogeneous grating as a mask, to form a triangular groove shape of the blazed grating by etching different portions of the substrate with the obscuring effect of the mask formed by the homogeneous grating on the ion beam. An etching angle of the Ar ion beam is obtained according to the required blaze angle by the following empirical formula (1).

$$\theta s \approx \alpha - 3° \quad (1)$$

In the empirical formula (1), $\theta s$ is the blaze angle of the blazed grating, and $\alpha$ is the etching angle of the Ar ion beam. For example, if a blazed grating with a blaze angle $\theta s$ of 15 degrees is fabricated, the etching angle $\alpha$ of the Ar ion beam is 18 degrees. In general application, the blaze angle $\theta s$ of the blazed grating is not more than 40 degrees, generally ranges from 5 degrees to 37 degrees. Therefore, the etching angle $\alpha$ of the Ar ion beam may range from 8 degrees to 40 degrees. The specific technological parameters of the tilted Ar ion beam scanning etching are ion energy of 380 eV to 520 eV, an ion beam current of 70 mA to 140 mA, an acceleration voltage of 240 V to 300 V, and a working pressure of $2.0 \times 10^{-2}$ Pa.

In Step 16 may include cleaning the substrate to obtain the holographic blazed grating.

In the above-mentioned fabrication method, the groove shape of the homogeneous grating obtained by employing the vertical ion beam etching may be a rectangle or a trapezoid. Generally, in the case that the groove shape of the photoresist grating is regular, the groove shape of the homogeneous grating obtained by employing the vertical ion beam etching is a rectangle. However, since the durations for the upper portion and the lower portion of the photoresist reacting with the developer are different in developing the photoresist grating mask, the upper portion of the photoresist grating shrinks to make the groove shape of the grating into a cone. In this case, the homogeneous grating formed by performing the vertical ion beam etching and using the photoresist grating as a mask is a trapezoid. With respect to the homogeneous gratings with different groove shape, the durations for vertical ion beam etching, i.e., the groove depth of the homogeneous grating, are calculated by different formulas.

Figure 3:
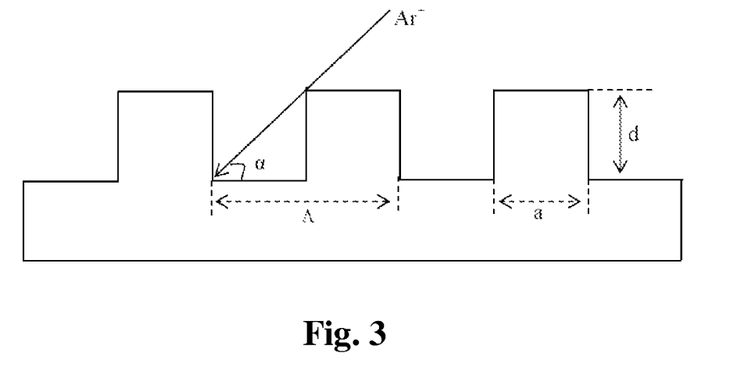
FIG. 3 is a geometric relation graph for a rectangle grating.

For the rectangle grating, referring to FIG. 3, the calculation formula is $$tg\alpha = \frac{d}{\Lambda(1-f)} \quad (2)$$

In formula (2), $\alpha$ is the etching angle of the Ar ion beam, d is the groove depth of the homogeneous grating, $\Lambda$ is the period of the homogeneous grating, a is the width of the homogeneous grating and $f=a/\Lambda$ is the duty cycle of the homogeneous grating.

Figure 4:
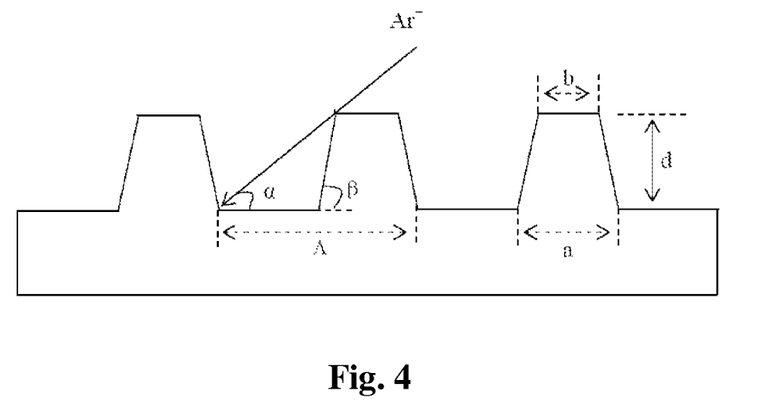
FIG. 4 is a geometric relation graph for a trapezoid grating.

For the trapezoid grating, referring to FIG. 4, the calculation formula is $$tg\alpha = \frac{d}{\Lambda \times (1-f) + \frac{d}{tg\beta}} \quad (3)$$

In formula (3), $\alpha$ is the etching angle of the Ar ion beam, d is the groove depth of the homogeneous grating, $\Lambda$ is the period of the homogeneous grating, a is the width of the homogeneous grating, $f=a/\zeta$ is the duty cycle of the homogeneous grating and $\beta$ is the base angle of the trapezoid.

In the above-mentioned two formulas, the based geometric relation is that: the etching angle of the tilted Ar ion beam is equal to the angle required for the tilted Ar ion beam slanting from a vertex angle of the homogeneous grating to a base angle opposite to the vertex angle, due to the groove depth of the homogeneous grating.

The duration for the tilted Ar ion beam scanning etching is set appropriately to etch the homogeneous grating up. In practical application, due to technological conditions of the restrictions, there is remaining homogeneous grating during the process of the tilted Ar ion beam etching to avoid over-etching, and the remaining homogeneous grating forms a rake angle of the blazed grating.

Optionally, the duty cycle of the homogeneous grating structure on the substrate ranges from 0.25 to 0.6, and the period of the homogeneous grating structure on the substrate ranges from 300 nm to 3000 nm.

Hereinafter, the method for fabricating the holographic blazed grating according to the present disclosure is illustrated in detail by means of several specific embodiments. It is to be understood that the parameters specified in the under-mentioned several embodiments are only several specific applications in the scope protected by the disclosure, but are not to limit the scope of protection of the disclosure.

Figure 5:
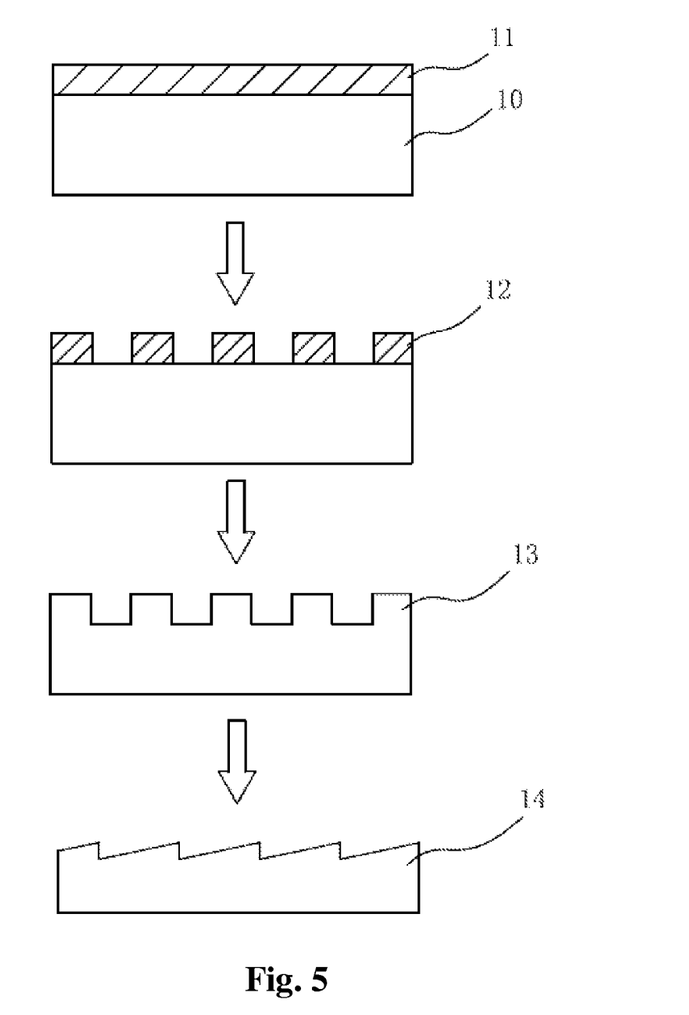
FIG. 5 is an effect schematic diagram corresponding to each of steps according to a first embodiment of the disclosure.

First embodiment: referring to FIG. 5, which is an effect schematic diagram corresponding to each of steps according to the first embodiment of the disclosure. A holographic blazed grating with the period of 833 nm and the blaze angle $\theta s$ of 10 degrees is fabricated by using interference lithography, vertical ion beam etching and the tilted Ar ion beam scanning etching. The fabricated homogeneous grating is a rectangle grating, of which the duty cycle is $f=a/\Lambda=0.5$. The method for fabricating the holographic blazed grating according to the first embodiment of the disclosure includes the following steps.

(1) A photoresist layer 11 having a thickness of 300 nm is coated on a quartz substrate 10.

(2) Interference lithography is performed to form a photoresist grating mask 12.

(3) Taking the rectangle grating (see FIG. 3) as an example, firstly the etching depth required for fabricating the blazed grating with the blaze angle $\theta s$ of 10 degrees is analyzed. It is obtained that the groove depth d of the homogeneous grating mask is 96 nm by the formula (2). The photoresist grating is transferred onto the substrate by using the photoresist grating 12 as a mask and performing ion beam etching, to form a homogeneous grating 13. The groove depth d is 96 nm. In this case, Ar ion beam etching is adopted, in which the ion energy is 400 eV, the ion beam current is 100 mA, the acceleration voltage is 260 V and the working pressure is $2.0 \times 10^{-2}$ Pa.

(4) The substrate is cleaned to remove remaining photoresist.

(5) By using the homogeneous grating 13 as a mask and performing tilted Ar ion beam scanning etching, the different portions of the substrate 10 are etched by utilizing the obscuring effect of the homogeneous grating mask on the ion beam, to form a triangular blazed grating 14. In this case, the etching angle of the ion beam is $\alpha = \theta s + 3° = 13°$. The Ar ion beam etching is adopted, in which the ion energy is 450 eV, the ion beam current is 100 mA, the acceleration voltage is 260 V and the working pressure is $2.0 \times 10^{-2}$ Pa. The duration for etching is set appropriately to etch the homogeneous grating 13 up. And therefore the blazed grating 14 with the blaze angle θs of 10 degrees is obtained.

(6) The substrate is cleaned.

Figure 6:
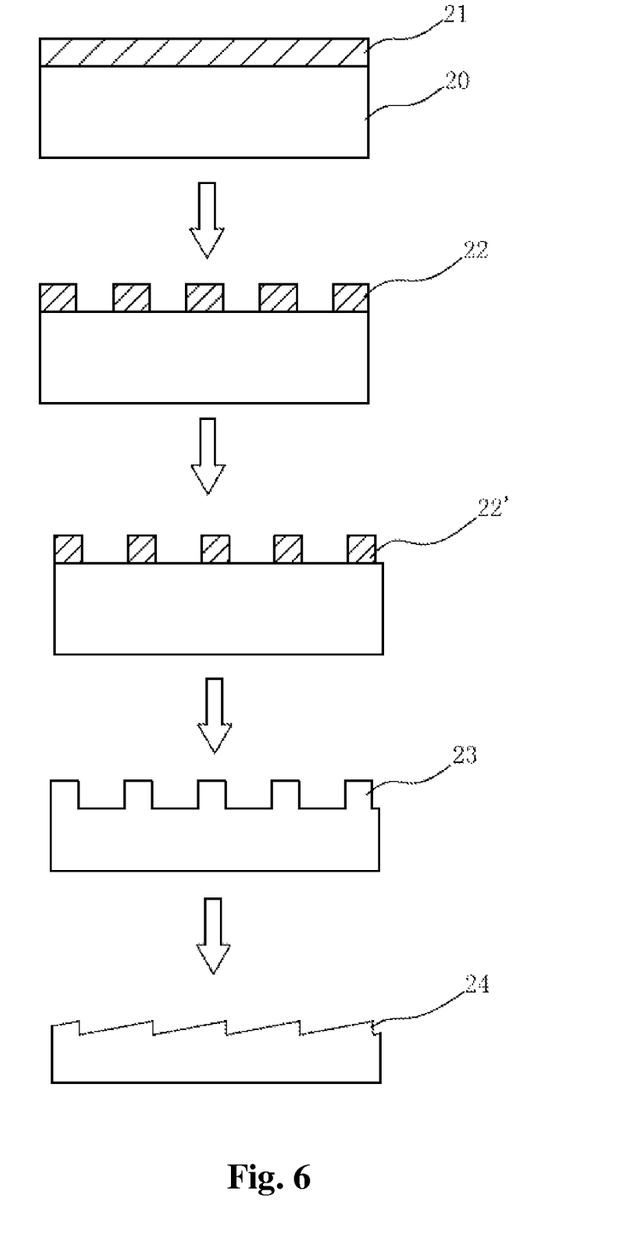
FIG. 6 is an effect schematic diagram corresponding to each of steps according to a second embodiment of the disclosure.

Second embodiment: referring to FIG. 6, which is an effect schematic diagram corresponding to each of steps according to the second embodiment of the invention. A holographic blazed grating with the period of 833 nm and the blaze angle θs of 15 degrees is fabricated by using interference lithography, vertical ion beam etching and the tilted Ar ion beam scanning etching. The fabricated homogeneous grating is a rectangle grating, of which the duty cycle is $f=a/\Lambda=0.35$. The method for fabricating the holographic blazed grating according to the second embodiment of the invention includes the following steps.

(1) A photoresist layer 21 having a thickness of 500 nm is coated on a quartz substrate 20.

(2) Interference lithography is performed to form a photoresist grating 22.

(3) An ashing process is performed on the photoresist grating 22. The duty cycle of the photoresist grating 22 is regulated to form a new photoresist grating 22'. A homogeneous grating with the duty cycle of 0.35 may be formed on the substrate 20 by transferring the photoresist grating 22'. In general, the duty cycle of the photoresist grating 22 formed by the interference lithography ranges from 0.5 to 0.6. The duty cycle of the photoresist grating 22 is further shrunken after being processed by the ashing technology, to form the new photoresist grating 22'. The duty cycle of the photoresist grating 22' may be approximately 0.35. In this case, the duty cycle of the homogeneous grating formed by using the new photoresist grating 22' as a mask can be regulated to 0.35. The specific ashing technology is as followed: the substrate with the photoresist grating is put into a reaction ion etcher and is etched by using oxygen reaction ion, in which the radio frequency power is 45 W, the self-bias is 300 V and the working pressure is 1.0 Pa.

(4) The vertical ion beam etching is performed on the substrate 20 by using the above-mentioned photoresist grating 22' as the mask, and the groove shape of the photoresist grating 22' is transferred onto the substrate 20, to form a homogeneous grating 23. Firstly the etching depth required for manufacturing the grating with the blaze angle θs of 15 degrees is analyzed. It is obtained that the groove depth d of the grating mask is 176 nm by the formula (2). The photoresist grating mask is transferred onto the substrate by using the photoresist grating 22' as a mask and performing ion beam etching, to form the homogeneous grating 23. The etched groove depth d is 176 nm. In this case, the $CHF_3$ reaction ion beam etching is adopted, in which the ion energy is 400 eV, the ion beam current is 100 mA, the acceleration voltage is 240 V and the working pressure is $1.4 \times 10^{-2}$ Pa.

(5) The substrate is cleaned to remove remaining photoresist.

(6) By performing tilted Ar ion beam scanning etching, the different portions of the substrate 20 are etched by utilizing the obscuring effect of the mask formed by the homogeneous grating 23 on the ion beam, to form a triangular blazed grating groove shape. In this case, the etching angle of the ion beam is $\alpha=\theta s+3°=18°$. The Ar ion beam etching is adopted, in which the ion energy is 450 eV, the ion beam current is 100 mA, the acceleration voltage is 260 V and the working pressure is $2.0 \times 10^{-2}$ Pa. The duration for etching is set appropriately so that the homogeneous grating mask is fully etched. And therefore the blazed grating 24 with the blaze angle θs of 15 degrees is obtained.

(7) The substrate is cleaned.

Figure 7:
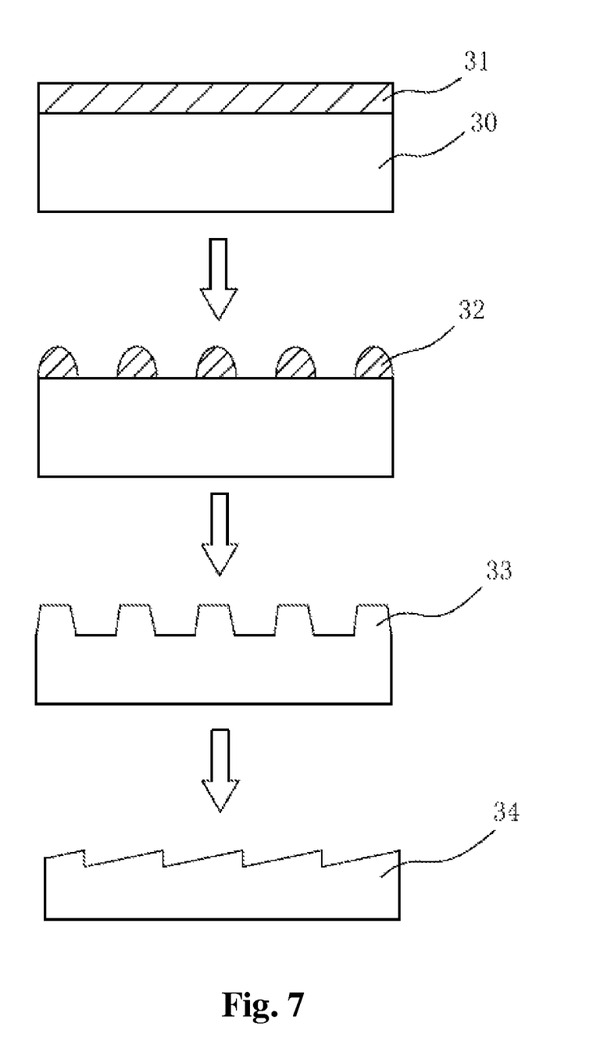
FIG. 7 is an effect schematic diagram corresponding to each of steps according to a third embodiment of the disclosure.

Third embodiment: referring to FIG. 7, which is an effect schematic diagram corresponding to each of steps according to the third embodiment of the invention. A holographic blazed grating with the period of 500 nm and the blaze angle θs of 20 degrees is fabricated by using interference lithography, vertical ion beam etching and tilted Ar ion beam scanning etching. The fabricated homogeneous grating is a trapezoid grating, of which the base angle β is 80 degrees and the duty cycle is 0.5. The method for fabricating the holographic blazed grating according to the third embodiment of the invention includes the following steps.

(1) A photoresist layer 31 having a thickness of 300 nm is coated on a substrate 30.

(2) Interference lithography is performed to form a photoresist grating 32. Herein, in the process of developing the photoresist grating, since the durations for the upper portion and the lower portion of the photoresist reacting with the developer are different, the upper portion of the photoresist is narrower than the lower portion of the photoresist, so that the groove shape of the photoresist grating is cone-shaped.

(3) The vertical ion beam etching is performed on the substrate 30 by using the photoresist grating 32 as a mask, and the groove shape of the photoresist grating 32 is transferred onto the substrate 30, to form a homogeneous grating 33. Firstly the etching depth d required for fabricating the grating with the blaze angle θs of 20 degrees is analyzed. It is obtained that the groove depth d of the grating mask is 115 nm by the formula (3). The photoresist grating mask is transferred onto the substrate by using the photoresist grating 32 as a mask and performing vertical ion beam etching. The etched groove depth d is 115 nm. In this case, the Ar ion beam etching is adopted, in which the ion energy is 450 eV, the ion beam current is 100 mA, the acceleration voltage is 260 V and the working pressure is $2.0 \times 10^{-2}$ Pa.

(4) The substrate is cleaned to remove remaining photoresist.

(5) By performing tilted Ar ion beam scanning etching, the different portions of the substrate 30 are etched by utilizing the obscuring effect of the mask formed by the homogeneous grating 33 on the ion beam, to form a triangular groove shape of the blazed grating. In this case, the etching angle of the ion beam is $\alpha=\theta s+3°=23°$. The Ar ion beam etching is adopted, in which the ion energy is 500 eV, the ion beam current is 100 mA, the acceleration voltage is 260 V and the working pressure is $2.0 \times 10^{-2}$ Pa. The duration for etching is set appropriately to etch the homogeneous grating mask up. And therefore the blazed grating 34 with the blaze angle θs of 20 degrees is obtained.

(6) The substrate is cleaned.

Figure 8:
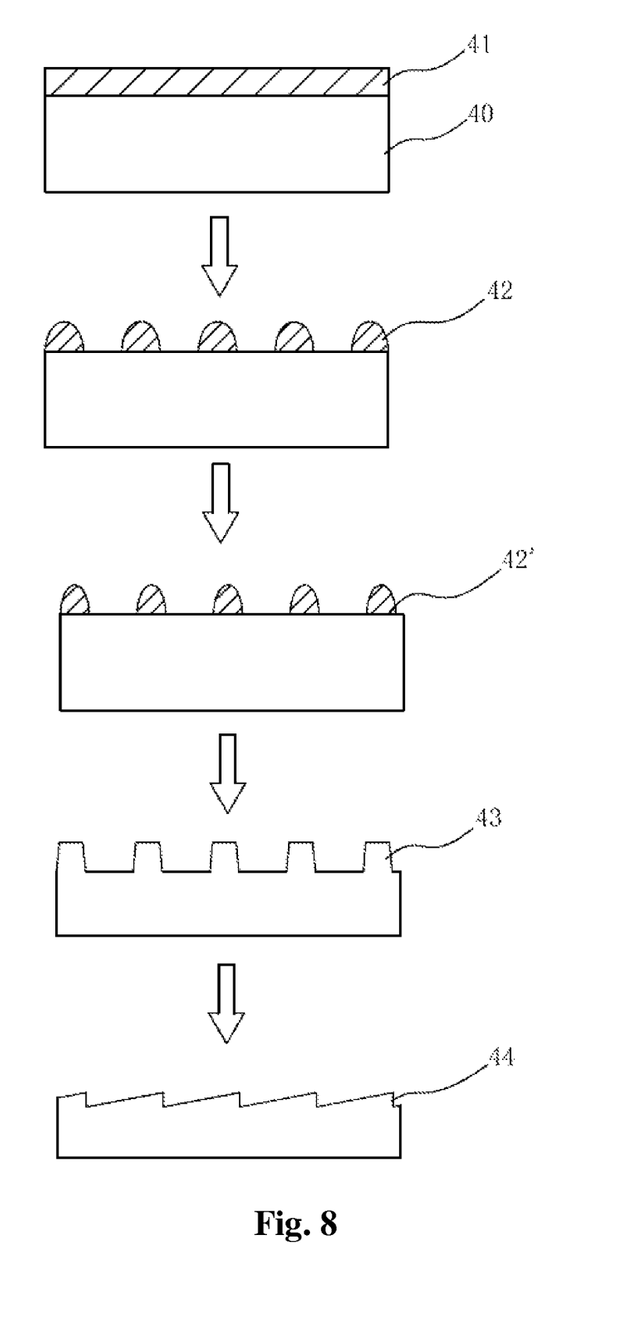
FIG. 8 is an effect schematic diagram corresponding to each of steps according to a fourth embodiment of the disclosure.

Fourth embodiment: referring to FIG. 8, which is an effect schematic diagram corresponding to each of steps according to the fourth embodiment of the disclosure. A holographic blazed grating with the period of 2000 nm and the blaze angle θs of 10 degrees is fabricated by using interference lithography, vertical ion beam etching and tilted Ar ion beam scanning etching. The fabricated homogeneous grating is a trapezoid grating, of which the base angle β is 80 degrees and the duty cycle is 0.35. The method for fabricating the holographic blazed grating according to the fourth embodiment of the invention includes the following steps.

(1) A photoresist layer 41 having a thickness of 500 nm is coated on a substrate 40.

(2) Interference lithography is performed to form a photoresist grating 42.

(3) An ashing process is performed on the photoresist grating 42. The duty cycle of the photoresist grating 42 is regulated to form a new photoresist grating 42'. A homogeneous grating with the duty cycle of 0.35 may be formed on the substrate 40 after performing vertical ion beam etching on the photoresist grating 42'. In general, the duty cycle of the photoresist grating 42 formed by the interference lithography ranges from 0.5 to 0.6. The duty cycle of the photoresist grating 42 is further shrunken after being processed by the ashing technology, to form the new photoresist grating 42'. The duty cycle of the photoresist grating 42' may be approximately 0.35. In this case, the duty cycle of the homogeneous grating formed by using the new photoresist grating 42' as a mask can be regulated to 0.35. The specific ashing technique includes, the substrate with the photoresist grating is put into a reaction ion etcher and is etched by using oxygen reaction ion, in which the radio frequency power is 45 W, the self-bias is 300 V and the working pressure is 1.0 Pa.

(4) The vertical ion beam etching is performed on the substrate 40 by using the above-mentioned photoresist grating 42' as the mask, and the groove shape of the photoresist grating 42' is transferred onto the substrate 40, to form a homogeneous grating 43. Firstly the etching depth required for fabricating the grating with the blaze angle $\theta s$ of 10 degrees is analyzed. It is obtained that the groove depth d of the homogeneous grating 43 is 313 nm by the formula (3). The photoresist grating mask is transferred onto the substrate 40 by using the photoresist grating 42' as a mask and performing ion beam etching. The etched groove depth is 313 nm. In this case, the $CHF_3$ reaction ion beam etching is adopted, in which the ion energy is 450 eV, the ion beam current is 100 mA, the acceleration voltage is 260 V and the working pressure is $1.4 \times 10^{-2}$ Pa.

(5) The substrate is cleaned to remove remaining photoresist.

(6) By performing tilted Ar ion beam scanning etching, the different portions of the substrate 40 are etched by utilizing the obscuring effect of the mask formed by the homogeneous grating 43 on the ion beam, to form a triangular blazed grating groove shape. In this case, the etching angle of the ion beam is $\alpha = \theta s + 3° = 13°$. The Ar ion beam etching is adopted, in which the ion energy is 500 eV, the ion beam current is 100 mA, the acceleration voltage is 260 V and the working pressure is $2.0 \times 10^{-2}$ Pa. The duration for etching is set appropriately to etch the homogeneous grating mask up. And therefore the blazed grating 44 with the blaze angle $\theta s$ of 10 degrees is obtained.

(7) The substrate is cleaned.

In above-mentioned embodiments, besides the quartz glass, the substrate may be K9 glass or other transparent optical materials.

In summary, a method for fabricating a holographic blazed grating is provided according to the embodiments of the disclosure, in which firstly a homogeneous grating is fabricated on a substrate and tilted ion beam etching is performed by using the homogeneous grating as a mask to obtain the required blazed grating. The embodiments of the disclosure have the following features compared with the conventional technique.

Firstly, the duration for vertical ion beam etching can be controlled in fabricating the homogeneous grating, thus the groove depth of the homogeneous grating is controlled precisely. Thereby an approach for controlling the blaze angle of the blazed grating is obtained.

Secondly, after a photoresist grating is obtained by interference lithography, an ashing technique may further be performed to control the duty cycle of the grating, and the required duty cycle of the homogeneous grating is controlled. Thereby another approach for controlling the blaze angle of the blazed grating is obtained.

Thirdly, in performing tilted Ar ion beam scanning etching, the etching rate for the mask and the substrate may always be consistent by using the homogeneous grating of the same material as the mask. Thereby the precision of fabricating the blazed grating is improved.

The above description for the disclosed embodiments enables those of ordinary skill in the art to practice or use the disclosure. It will be apparent to those of ordinary skill in the art that various modifications may be made to the embodiments, and the generic principles defined herein may be applied to other embodiments without departing from the spirit or scope of the disclosure. Thus, the present disclosure is not intended to be limited to the embodiments shown herein, but is to be accorded the widest scope consistent with the principles and novel features disclosed herein.

What is claimed is:

1. A method for fabricating a holographic blazed grating, comprising:
    1) coating a photoresist layer on a substrate;
    2) performing lithography on the photoresist layer to form a photoresist grating;
    3) performing vertical ion beam etching on the substrate by using the photoresist grating as a mask, to form a homogeneous grating by transferring a pattern of the photoresist grating onto the substrate;
    4) cleaning the substrate to remove remaining photoresist;
    5) performing tilted Ar ion beam scanning etching on the substrate by using the homogeneous grating as a mask, and etching different portions of the substrate by utilizing a obscuring effect of the homogeneous grating mask on the ion beam, to form a triangular groove shape of the blazed grating; and
    6) cleaning the substrate to obtain the holographic blazed grating; and
    wherein both the homogeneous grating and the holographic blazed grating are formed on the same kind of material which is the substrate, and
    after the Step 2), the method further comprises performing an ashing process on the photoresist grating to regulate a duty cycle of the photoresist grating, wherein the ashing process is performed by putting the substrate with the photoresist grating into a reaction ion etcher and etching it by using oxygen reaction ion, and the duty cycle of the photoresist grating is regulated to be in a range from 0.25 to 0.35, such that the duty cycle of the homogeneous grating is in the range from 0.25 to 0.35.

2. The method for fabricating the holographic blazed grating according to claim 1, wherein the coated photoresist layer in the Step 1) has a thickness of 200 nm to 500 nm.

3. The method for fabricating the holographic blazed grating according to claim 1, wherein in the Step 3) an Ar ion beam etching method or a $CHF_3$ reaction ion beam etching method is adopted as the vertical ion beam etching;
    wherein in the case that the Ar ion beam etching method is adopted, specific technological parameters are ion energy of 380 eV to 520 eV, an ion beam current of 70 mA to 140 mA, an acceleration voltage of 240 V to 300 V and a working pressure of $2.0 \times 10^{-2}$ Pa; in the case that the $CHF_3$ reaction ion beam etching method is adopted, the specific technological parameters are ion energy of 300 eV to 470 eV, an ion beam current of 70 mA to 140 mA, an acceleration voltage of 200 V to 300 V and a working pressure of $1.4 \times 10^{-2}$ Pa.

4. The method for fabricating the holographic blazed grating according to claim 1, wherein a period of the grating ranges from 300 nm to 3000 nm.

5. The method for fabricating the holographic blazed grating according to claim 1, wherein the homogeneous grating is a rectangle grating or a trapezoid grating.

6. The method for fabricating the holographic blazed grating according to claim 1, an etching angle of the tilted Ar ion beam is equal to an angle required for the tilted Ar ion beam slanting from a vertex angle of the homogeneous grating to a base angle opposite to the vertex angle, due to a groove depth of the homogeneous grating.

7. The method for fabricating the holographic blazed grating according to claim 1, wherein in the Step 45) technological parameters for the tilted Ar ion beam scanning etching are ion energy of 380 eV to 520 eV, an ion beam current of 70 mA to 140 mA, an acceleration voltage of 240 V to 300 V, a working pressure of $2.0 \times 10^{-2}$ Pa and an etching angle of the tilted Ar ion beam of 8 degrees to 40 degrees.

* * * * *